United States Patent
Shin

(10) Patent No.: US 7,829,412 B2
(45) Date of Patent: Nov. 9, 2010

(54) METHOD OF MANUFACTURING FLASH MEMORY DEVICE

(75) Inventor: Seung Woo Shin, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 1058 days.

(21) Appl. No.: 11/582,639

(22) Filed: Oct. 17, 2006

(65) Prior Publication Data

US 2007/0231986 A1   Oct. 4, 2007

(30) Foreign Application Priority Data

Mar. 28, 2006   (KR) .......................... 10-2006-27819

(51) Int. Cl.
    *H01L 21/336* (2006.01)
(52) U.S. Cl. .................. 438/261; 257/E21.679
(58) Field of Classification Search .................. 438/260, 438/954
    See application file for complete search history.

(56) References Cited

U.S. PATENT DOCUMENTS

| 5,387,534 A * | 2/1995 | Prall .......................... 438/287 |
| 6,228,699 B1 | 5/2001 | Huang |
| 6,248,633 B1 | 6/2001 | Ogura et al. |
| 6,677,255 B1 | 1/2004 | Shih et al. |
| 6,867,097 B1 | 3/2005 | Ramsbey et al. |
| 7,183,158 B2 * | 2/2007 | Chu et al. .................. 438/257 |
| 2005/0148173 A1 | 7/2005 | Shone |
| 2005/0255654 A1 | 11/2005 | Lee et al. |

FOREIGN PATENT DOCUMENTS

| CN | 1428846 | 7/2003 |
| JP | 06-310654 | 11/1994 |
| KR | 100155859 B1 | 7/1998 |
| KR | 1020010049164 A | 6/2001 |
| KR | 1020010065285 A | 7/2001 |
| KR | 102002001247 A | 1/2002 |
| KR | 100423576 B1 | 3/2004 |
| KR | 100423577 B1 | 3/2004 |
| KR | 1020050022624 A | 3/2005 |

* cited by examiner

*Primary Examiner*—Chandra Chaudhari
(74) *Attorney, Agent, or Firm*—Townsend and Townsend and Crew LLP

(57) ABSTRACT

A method of manufacturing a flash memory device is disclosed. A first oxide layer, a nitride layer, a second oxide layer, and a first polysilicon layer, which is a part of a polysilicon layer for a control gate, are formed to a predetermined thickness on a semiconductor substrate. A first etch process is performed to form gate patterns. An insulating layer is formed on the entire surface. A second etch process is implemented so that insulating layer spacers are formed on both sidewalls of each gate pattern while exposing the first polysilicon layer. A second polysilicon layer for the control gate is formed on the entire surface.

16 Claims, 2 Drawing Sheets

METHOD OF MANUFACTURING FLASH MEMORY DEVICE

BACKGROUND OF THE INVENTION

The present invention relates, in general, to a method of manufacturing a flash memory device, in which at the time of forming the gate of a SONOS (Silicon Oxide Nitride Oxide Silicon) structure, a first polysilicon layer (i.e., a part of a polysilicon layer for a control gate) is formed to a predetermined thickness, an etch process for exposing a field oxide layer between cells is performed, an insulating layer is buried or an insulating layer spacer is formed, and a second polysilicon layer is formed, thereby preventing program disturbance.

A flash memory is a kind of a non-volatile memory that retains information stored therein although power is turned off, and it is largely classified into a NOR type and a NAND type.

The NOR flash memory requires one contact per two cells. The NOR flash memory may be undesirable in a high level of integration, but may be desirable in a high speed application since a cell current is high. The NAND flash memory may be undesirable in a high speed application since a cell current is low, but may be desirable in a high level of integration since a number of cells share one contact. Accordingly, the NAND flash memory has recently been used in digital still cameras, etc. and therefore has been in the spotlight as the next-generation memory.

A general flash memory cell has a structure in which a tunnel oxide layer, a floating gate, a gate dielectric layer, and a control gate are sequentially laminated on a semiconductor substrate. Program and erase operations are performed by injecting electrons into or extracting them from the floating gate. The flash memory cell is the so-called "floating gate memory".

The floating gate memory may be restricted in scale due to a voltage-divided coupling method and an IPO (Inter-Poly Oxide) structure. Recently, a non-volatile memory of the SONOS (Silicon Oxide Nitride Oxide Silicon) structure, which has solved the scale-down restriction of the floating gate memory, has been in the spotlight.

The non-volatile memory of the SONOS structure employs the difference in the electrical potential between the oxide layer and the nitride layer. This corresponds to the principle that electrons trapped at the nitride layer retain its non-volatile characteristic without being lost although power is turned off by the potential barrier of an immediately underlying oxide layer.

A program operation is performed by applying a voltage through which electrons can tunnel through a thin oxide layer under the nitride layer. A read operation is performed in such a manner that a differential amplifier classifies a difference in the driving current, which is incurred by a difference in the threshold voltage of a transistor depending on the program.

In the gate of the conventional SONOS structure described above, however, electrons trapped at the nitride layer flow into a nitride layer of a neighboring gate due to a hopping phenomenon. Accordingly, a problem arises because electrons generate undesirable results including program disturbance.

SUMMARY OF THE INVENTION

The present invention relates to a method of manufacturing a flash memory device, in which at the time of forming the gate of the SONOS structure, a first polysilicon layer (i.e., a part of a polysilicon layer for a control gate) is formed to a predetermined thickness, an etch process for exposing a field oxide layer between cells is performed, an insulating layer is buried or an insulating layer spacer is formed, and a second polysilicon layer is formed, thereby preventing program disturbance.

In one embodiment of the present invention, there is provided a method of manufacturing a flash memory device. A first oxide layer, a nitride layer, a second oxide layer, and a first polysilicon layer, which is a part of a polysilicon layer for a control gate, are formed to a predetermined thickness on a semiconductor substrate. A first etch process is performed to form gate patterns. An insulating layer is formed on the entire surface. A second etch process is implemented so that insulating layer spacers are formed on both sidewalls of each gate pattern while exposing the first polysilicon layer. A second polysilicon layer for the control gate is formed on the entire surface. The predetermined thickness may be in the range of about 100 Å to about 500 Å.

In another embodiment of the present invention, there is provided a method of manufacturing a flash memory device. A first oxide layer, a nitride layer, a second oxide layer, and a first polysilicon layer, which is a part of a polysilicon layer for a control gate, are formed to a predetermined thickness on a semiconductor substrate. A first etch process is performed to form gate patterns. An insulating layer is formed on the entire surface. A chemical mechanical polishing (CMP) process is performed and a second polysilicon layer for the control gate is then formed on the entire surface.

The first oxide layer may be a silicon oxide layer ($SiO_2$) formed by oxidizing the semiconductor substrate using a chemical wet oxidation process or a radical oxidation process. The second oxide layer may be an oxide layer with a high dielectric constant.

At the time of forming the insulating layer, a height H of the insulating layer may be set to be about two to about four times a distance W between the gate patterns.

The CMP process may be performed until the first polysilicon layer remains about 50 Å to about 100 Å in height.

BRIEF DESCRIPTION OF THE DRAWINGS

A more complete appreciation of the invention will be readily apparent as the same becomes better understood by reference to the following detailed description when considered in conjunction with the accompanying drawings in which like reference symbols indicate the same or similar components, wherein.

DESCRIPTION OF SPECIFIC EMBODIMENTS

The present invention will now be described in detail in connection with certain exemplary embodiments with reference to the accompanying drawings.

Figure 1A:
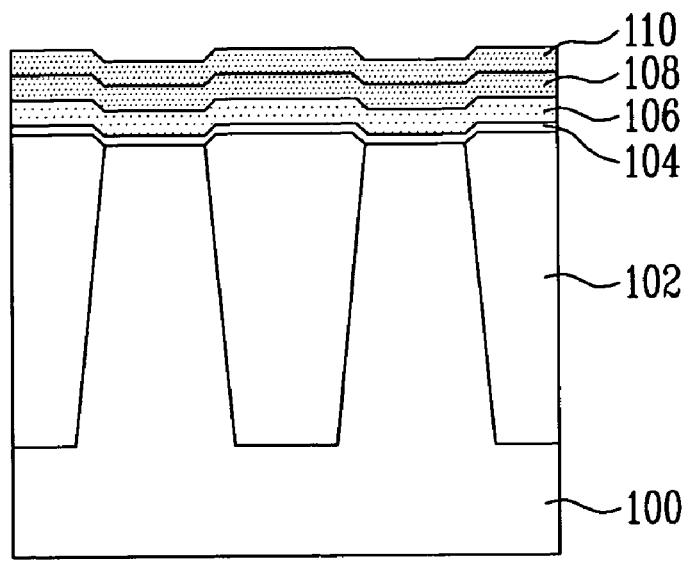
FIGS. 1A to 1C are cross-sectional view illustrating a method of manufacturing a flash memory device according to one embodiment of the present invention.
Figure 1B:
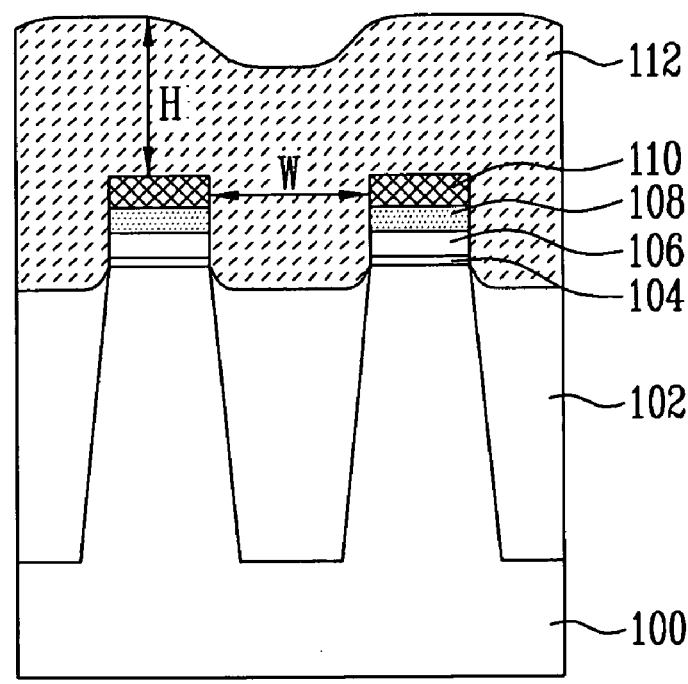
Figure 1C:
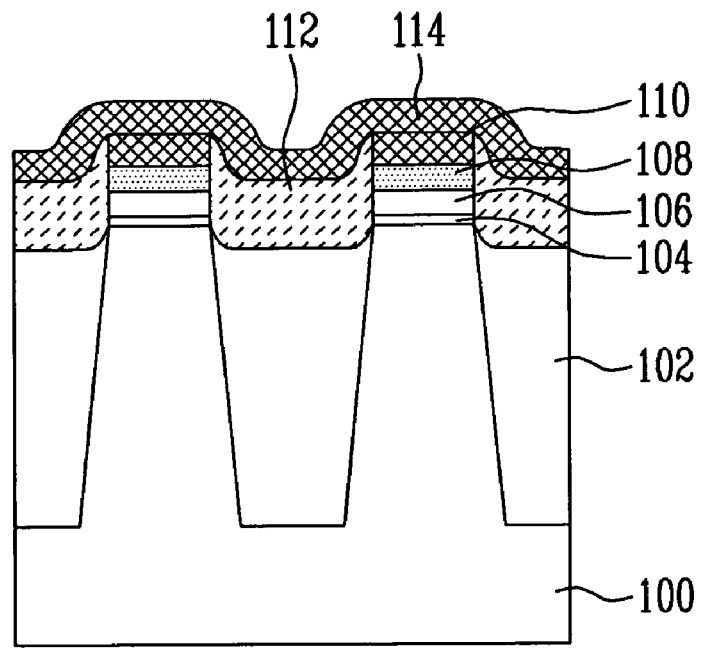

FIGS. 1A to 1C are cross-sectional view illustrating a method of manufacturing a flash memory device according to one embodiment of the present invention.

Referring to FIG. 1A, trenches are formed in predetermined regions of a semiconductor substrate 100. A field oxide layer 102 is formed within the trenches to define an active region and an isolation region. A first oxide layer 104, a nitride layer 106 for a floating gate, a second oxide layer 108, and a first polysilicon layer 110 (i.e., a part of a polysilicon layer for a control gate) are formed to a predetermined thickness on the entire surface.

The first oxide layer 104 may include a silicon oxide layer (SiO$_2$) formed by oxidizing the semiconductor substrate 100 using a chemical wet oxidation process or a radical oxidation process.

The nitride layer 106 may include a silicon nitride layer (Si$_3$N$_4$) formed by any one of an atomic layer deposition (ALD), a plasma enhanced ALD, a chemical vapor deposition (CVD), or a rapid thermal anneal (RTP) process.

The second oxide layer 108 may be formed using an oxide layer with a high dielectric constant (for example, Al$_2$O$_3$, HfO$_2$, ZrO$_3$, Al$_2$O$_3$—HfO$_2$ mixture, SrTiO$_3$, La$_2$O$_3$, SrTiO$_3$, BaTiO$_3$) at a temperature of about 200° C. to about 1000° C. by any one of an atomic layer deposition (ALD), a plasma enhanced ALD, a chemical vapor deposition (CVD), or a rapid thermal anneal (RTP) process.

The first polysilicon layer 110 may be formed to a thickness of about 100 Å to about 500 Å.

Referring to FIG. 1B, a photoresist layer (not shown) is formed on the first polysilicon layer 110 on the active region of the semiconductor substrate 100. Exposure and development processes are then performed to sequentially etch the first polysilicon layer 110, the second oxide layer 108, the nitride layer 106, and the first oxide layer 104 on the isolation region of the semiconductor substrate 100, thus exposing the field oxide layer 102 and forming gate patterns accordingly. The photoresist layer (not shown) is stripped.

An insulating layer 112 is formed on the entire surface. A height H of the insulating layer 112 may be set to be about two to about four times a distance W between the gate patterns.

Referring to FIG. 1C, a blanket etch process (for example, a dry etch process) is performed to etch the insulating layer 112. At this time, an etch target is set so that the insulating layer 112 has a thickness to the extent that the insulating layer 112 on the first polysilicon layer 110 is completely stripped in a subsequent cleaning process. After a subsequent cleaning process, a height of the insulating layer 112 on the field oxide layer 102 is set to be approximately the same as that of the sidewalls of the gate patterns. Accordingly, the insulating layer (112) spacers are formed on both sidewalls of each gate pattern. A second polysilicon layer 114 for the control gate is formed on the entire surface.

Figure 2:
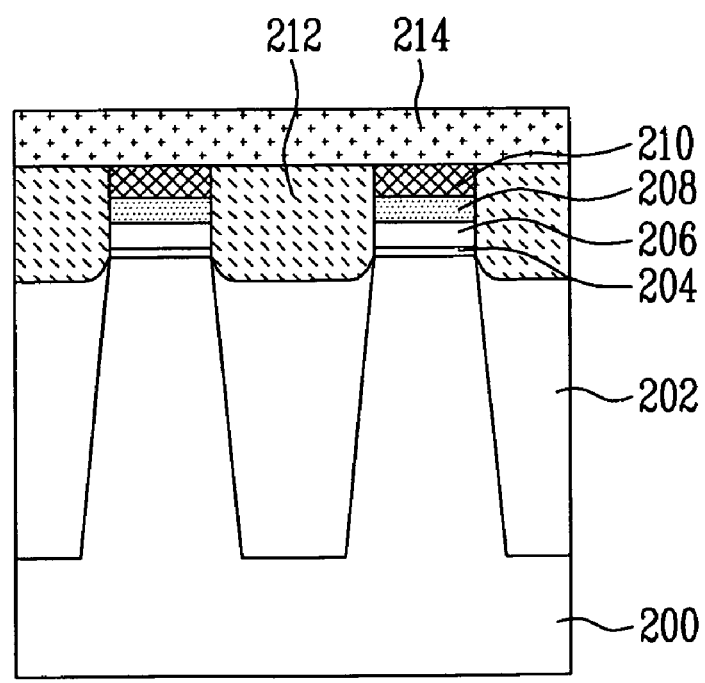
FIG. 2 is a final cross-sectional view of a flash memory device according to another embodiment of the present invention.

FIG. 2 is a final cross-sectional view of a flash memory device according to another embodiment of the present invention.

Referring to FIG. 2, trenches are formed in predetermined regions of a semiconductor substrate 200. A field oxide layer 202 is formed within the trenches to define an active region and an isolation region. A first oxide layer 204, a nitride layer 206 for a floating gate, a second oxide layer 208, and a first polysilicon layer 210 (i.e., a part of a polysilicon layer for a control gate) are formed to a predetermined thickness on the entire surface.

The first oxide layer 204 may include a silicon oxide layer (SiO$_2$) formed by oxidizing the semiconductor substrate 200 using a chemical wet oxidation process or a radical oxidation process.

The nitride layer 206 may include a silicon nitride layer (Si$_3$N$_4$) formed by any one of an atomic layer deposition (ALD), a plasma enhanced ALD, a chemical vapor deposition (CVD), or a rapid thermal anneal (RTP) process.

The second oxide layer 208 may be formed using an oxide layer with a high dielectric constant (for example, Al$_2$O$_3$, HfO$_2$, ZrO$_3$, Al$_2$O$_3$—HfO$_2$ mixture, SrTiO$_3$, La$_2$O$_3$, SrTiO$_3$, BaTiO$_3$) at a temperature of about 200° C. to about 2000° C. by any one of an atomic layer deposition (ALD), a plasma enhanced ALD, a chemical vapor deposition (CVD), or a rapid thermal anneal (RTP) process.

The first polysilicon layer 210 may be formed to a thickness of about 200 Å to about 500 Å.

A photoresist layer (not shown) is formed on the first polysilicon layer 210 on the active region of the semiconductor substrate 200. Exposure and development processes are then performed to sequentially etch the first polysilicon layer 210, the second oxide layer 208, the nitride layer 206, and the first oxide layer 204 on the isolation region of the semiconductor substrate 200, thus exposing the field oxide layer 202 and forming gate patterns accordingly. The photoresist layer (not shown) is stripped.

An insulating layer 212 is formed on the entire surface. A height of the insulating layer 212 may be set to be about two to about four times a distance between the gate patterns.

CMP is performed so that the first polysilicon layer 210 remains about 50 Å to about 100 Å in height. A second polysilicon layer 214 for a control gate is formed on the entire surface.

As described above, according to the present invention, at the time of forming the gate of the SONOS structure, a first polysilicon layer (i.e., a part of a polysilicon layer for a control gate) is formed to a predetermined thickness, an etch process for exposing a field oxide layer between cells is performed, an insulating layer is buried or an insulating layer spacer is formed, and a second polysilicon layer is formed. Accordingly, program disturbance can be prevented.

While the invention has been described in connection with what is presently considered to be practical exemplary embodiments, it is to be understood that the invention is not limited to the disclosed embodiments, but, is intended to cover various modifications and equivalent arrangements included within the spirit and scope of the appended claims.

What is claimed is:

1. A method of manufacturing a flash memory device, the method comprising:
    forming an insulating film in a trench of a semiconductor substrate;
    forming a first oxide layer, a nitride layer, a second oxide layer, and a first polysilicon layer to a predetermined thickness on the semiconductor substrate including the insulating film, the first polysilicon layer being part of a control gate;
    performing a first etch process to form gate patterns;
    forming an insulating layer on the entire surface;
    performing a second etch process so that insulating layer spacers are formed on both sidewalls of each gate pattern while exposing the first polysilicon layer; and
    forming a second polysilicon layer for the control gate on the entire surface.

2. The method of claim 1, wherein the predetermined thickness is in the range of about 100 Å to about 500 Å.

3. The method of claim 1, wherein the first oxide layer is a silicon oxide layer (SiO$_2$) formed by oxidizing the semiconductor substrate using a chemical wet oxidation process or a radical oxidation process.

4. The method of claim 1, wherein the nitride layer is a silicon nitride layer (Si$_3$N$_4$) formed by any one of an atomic layer deposition (ALD), a plasma enhanced ALD, a chemical vapor deposition (CVD), or a rapid thermal anneal (RTP) process.

5. The method of claim 1, wherein the second oxide layer has a high dielectric constant.

6. The method of claim 5, wherein the second oxide layer comprises any one of $Al_2O_3$, $HfO_2$, $ZrO_3$, $Al_2O_3$—$HfO_2$ mixture, $SrTiO_3$, $La_2O_3$, $SrTiO_3$, or $BaTiO_3$.

7. The method of claim 1, wherein the first polysilicon layer is formed to a thickness of about 100 Å to about 500 Å.

8. The method of claim 1, wherein at the time of forming the insulating layer, a height H of the insulating layer is set to be about two to about four times a distance W between the gate patterns.

9. A method of manufacturing a flash memory device, the method comprising:
   forming an insulating film in a trench of a semiconductor substrate;
   forming a first oxide layer, a nitride layer, a second oxide layer, and a first polysilicon layer to a predetermined thickness on the semiconductor substrate including the insulating film, the first polysilicon layer being part of a control gate;
   performing a first etch process to form gate patterns;
   forming an insulating layer on the entire surface; and
   performing a chemical mechanical polishing (CMP) process and then forming a second polysilicon layer for the control gate on the entire surface.

10. The method of claim 9, wherein the first oxide layer is a silicon oxide layer ($SiO_2$) formed by oxidizing the semiconductor substrate using a chemical wet oxidation process or a radical oxidation process.

11. The method of claim 9, wherein the nitride layer is a silicon nitride layer ($Si_3N_4$) formed by any one of an atomic layer deposition (ALD), a plasma enhanced ALD, a chemical vapor deposition (CVD), or a rapid thermal anneal (RTP) process.

12. The method of claim 9, wherein the second oxide layer has a high dielectric constant and is formed at a temperature of about 200° C. to about 1000° C. by any one of an atomic layer deposition (ALD), a plasma enhanced ALD, a chemical vapor deposition (CVD), or a rapid thermal anneal (RTP) process.

13. The method of claim 12, wherein the second oxide layer comprises any one of $Al_2O_3$, $HfO_2$, $ZrO_3$, $Al_2O_3$—$HfO_2$ mixture, $SrTiO_3$, $La_2O_3$, $SrTiO_3$, or $BaTiO_3$.

14. The method of claim 9, wherein the first polysilicon layer is formed to a thickness of about 200 Å to about 500 Å.

15. The method of claim 9, wherein at the time of forming the insulating layer, a height of the insulating layer is set to be about two to about four times a distance between the gate patterns.

16. The method of claim 9, wherein the CMP process is performed until the first polysilicon layer remains about 50 Å to about 100 Å in height.

\* \* \* \* \*